(12) United States Patent
Mickle et al.

(10) Patent No.: US 9,490,028 B2
(45) Date of Patent: Nov. 8, 2016

(54) LOW-POWER PULSE WIDTH ENCODING SCHEME AND COUNTER-LESS SHIFT REGISTER THAT MAY BE EMPLOYED THEREWITH

(71) Applicant: UNIVERSITY OF PITTSBURGH—OF THE COMMONWEALTH SYSTEM OF HIGHER EDUCATION, Pittsburgh, PA (US)

(72) Inventors: Marlin H. Mickle, Pittsburgh, PA (US); Vyasa Sai, Pittsburgh, PA (US); Ajay Ogirala, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 14/804,428

(22) Filed: Jul. 21, 2015

(65) Prior Publication Data
US 2015/0325311 A1 Nov. 12, 2015

Related U.S. Application Data

(62) Division of application No. 14/464,853, filed on Aug. 21, 2014, now Pat. No. 9,130,580, which is a division of application No. 13/568,663, filed on Aug. 7, 2012, now Pat. No. 8,864,027.

(60) Provisional application No. 61/522,072, filed on Aug. 10, 2011.

(51) Int. Cl.
*G06K 7/10* (2006.01)
*G11C 19/00* (2006.01)
(Continued)

(52) U.S. Cl.
CPC ........... *G11C 19/00* (2013.01); *G06K 7/10207* (2013.01); *G06K 19/0701* (2013.01); *G06K 19/073* (2013.01); *H03M 5/08* (2013.01); *H03M 7/00* (2013.01)

(58) Field of Classification Search
CPC .............. G06K 19/0701; G06K 7/10207; H03M 5/08; H03M 7/00
USPC ................... 235/439, 492; 342/52
See application file for complete search history.

(56) References Cited

U.S. PATENT DOCUMENTS 4,450,572 A    5/1984  Stewart et al.
5,023,891 A    6/1991  Johnson, III
(Continued)

OTHER PUBLICATIONS

Adam S.W. Man et al., Design and Implementation of a Low-power Baseband-system for RFID Tag, in IEEE International Symp. Circuits and Systems, pp. 1585-1588, May 2007.

(Continued)

*Primary Examiner* — Seung Lee
(74) *Attorney, Agent, or Firm* — Eckert Seamans Cherin & Mellott, LLC; Philip E. Levy

(57) ABSTRACT

A method of decoding, an encoded signal includes steps of receiving the encoded signal, creating a decoding signal by delaying the encoded signal by a predetermined amount of time $\Delta$, sampling the encoded signal using the decoding signal, and determining a value of each of a plurality of decoded bits represented by the encoded signal based on the sampling. Also, a method of operating a shift register wherein the shift register has an initialization state wherein a first binary symbol is stored in a first position and a second binary symbol different than the first binary symbol is stored in each of one or more intermediate positions and a last position. The method includes determining that the shift register is full responsive to detecting that the first binary symbol has been stored in either one of the intermediate positions or the last position.

6 Claims, 4 Drawing Sheets

(51) Int. Cl.
  *G06K 19/07* (2006.01)
  *H03M 7/00* (2006.01)
  *G06K 19/073* (2006.01)
  *H03M 5/08* (2006.01)

(56) References Cited

U.S. PATENT DOCUMENTS

| | | | |
|---|---|---|---|
| 5,027,085 A | 6/1991 | DeVito | |
| 6,798,272 B2 * | 9/2004 | Lehmann | G11C 19/00 327/525 |
| 7,277,506 B1 * | 10/2007 | Pope | H04L 25/03197 375/341 |
| 7,505,536 B2 * | 3/2009 | Yagi | H04L 1/0045 341/126 |
| 8,274,265 B1 | 9/2012 | Khanna et al. | |
| 2006/0192655 A1 | 8/2006 | Levin | |

OTHER PUBLICATIONS

Sung-Jin Kim et al., An Ultra Low Power UHF RFID Tag Front-end for EPCglobal Gen2 with Novel Clock-Free Decoder, IEEE International Symp. Circuits and Systems, pp. 660-663, May 2008.

J.C.S. Palma et al., A Passive 915 MHz UHF RFID Tag, 9th International Symp. on Quality Electronic Design (ISQED), pp. 348-351, Mar. 2008.

Chi Fat Chan et al., A Low-Power Signal Processing Front-End and Decoder for UHF Passive RFID Transponders, International, IEEE, pp. 1581-1584, 2009.

* cited by examiner

| | MSB | | | | LSB | EXTRA | |
|---|---|---|---|---|---|---|---|
| 6 | 5 | 4 | 3 | 2 | 1 | 0 | |
| $D_0$ | 1 | 0 | 0 | 0 | 0 | 0 | |

*FIG. 6A* — 25

| MSB | | | | | LSB | EXTRA |
|---|---|---|---|---|---|---|
| 6 | 5 | 4 | 3 | 2 | 1 | 0 |
| $D_1$ | $D_0$ | 1 | 0 | 0 | 0 | 0 |

*FIG. 6B* — 25

| MSB | | | | | LSB | EXTRA |
|---|---|---|---|---|---|---|
| 6 | 5 | 4 | 3 | 2 | 1 | 0 |
| $D_2$ | $D_1$ | $D_0$ | 1 | 0 | 0 | 0 |

*FIG. 6C* — 25

| MSB | | | | | LSB | EXTRA |
|---|---|---|---|---|---|---|
| 6 | 5 | 4 | 3 | 2 | 1 | 0 |
| $D_3$ | $D_2$ | $D_1$ | $D_0$ | 1 | 0 | 0 |

*FIG. 6D* — 25

| MSB | | | | | LSB | EXTRA |
|---|---|---|---|---|---|---|
| 6 | 5 | 4 | 3 | 2 | 1 | 0 |
| $D_4$ | $D_3$ | $D_2$ | $D_1$ | $D_0$ | 1 | 0 |

*FIG. 6E* — 25

| MSB | | | | | LSB | EXTRA |
|---|---|---|---|---|---|---|
| 6 | 5 | 4 | 3 | 2 | 1 | 0 |
| $D_5$ | $D_4$ | $D_3$ | $D_2$ | $D_1$ | $D_0$ | 1 |

LOW-POWER PULSE WIDTH ENCODING SCHEME AND COUNTER-LESS SHIFT REGISTER THAT MAY BE EMPLOYED THEREWITH

CROSS-REFERENCE TO RELATED APPLICATIONS

This application is a Divisional Application of U.S. patent application Ser. No. 14/464,853, filed on Aug. 21, 2014, entitled "Low-Power Pulse Width Encoding Scheme and Counter-Less Shift Register That May Be Employed Therewith," which is a Divisional Application of U.S. patent application Ser. No. 13/568,663, filed on Aug. 7, 2012, entitled "Low-power Pulse Width Encoding Scheme and counter-Less Shift Register That May Be Employed Therewith" (now U.S. Pat. No. 8,864,027), which claims priority under 35 U.S.C. §119(e) from U.S. Provisional Patent Application No. 61/522,072, filed. Aug. 10, 2011, the contents of which are incorporated herein by reference.

BACKGROUND OF THE INVENTION

1. Field of the Invention

The present invention pertains to data encoding schemes, and, in particular, to a data encoding scheme and associated decoding method and device that does not employ a digital clock or system clock signal. The present invention also pertains to a counter-less shift register that may be employed in connection with the data encoding scheme of the present invention.

2. Description of the Related Art

In a wireless serial data transmission system, a data stream in the form of a series of binary symbols (e.g., 1s and 0s) is typically transmitted from a transmitter device to a receiver device by: (i) encoding the data stream and thereby generating an encoded data signal (by converting the series of binary symbols to an analog form according to an encoding scheme), (ii) transmitting the encoded data signal from the transmitter device to the receiver using an appropriate modulation technique, (iii) receiving and demodulating the transmitted signal at the receiver device in order to obtain the original encoded data signal, and (iv) decoding the encoded data signal in the receiver device to extract obtain the original data stream (the series of binary symbols) from the encoded signal. In current data transmission methods, the receiving device extracts/obtains the original data stream from the encoded signal using an explicit clock signal that is common to the transmitter device and the receiver device. The explicit clock signal is either separately generated using additional clock circuitry provided as part of the receiver device or extracted from the transmitted data.

For example, one type of prior art encoding technique is known as pulse width coding (PWC) or pulse interval encoding (PIE). In PWC and PIE, each bit of data/binary symbol (e.g., each 1 and 0) is represented by an energy pulse having a certain duration. For instance, a 1 may be represented by a pulse having a width equal to 5 clock pulses and a 0 may be represented by a pulse having a width equal to 3 clock pulses. Thus, determining the number of clock pulses within each received energy pulse enables that energy pulse to be decoded as either a binary 1 or a binary 0. FIG. 1 is a schematic diagram representing such a PWC or PIE scheme. As will be appreciated, such a scheme requires a local, high frequency clock signal at the receiver device, which in turn leads to a high power requirement at the receiver device.

As another example, in Manchester encoding, the clock signal is provided within the code itself, allowing the clock to be extracted at the receiving end by sampling the received signal and counting the number of samples within each symbol received. This means that there must be a clock present at the receiver device that provides a sampling signal at a higher bit rate than the incoming data stream, which in turn leads to a high power requirement at the receiver device.

Power consumption is a major concern in many electronic systems. For example, power consumption is a major concern in UHF passive RFID tag systems, wherein the operating range of such systems mainly depends on the power consumption of the RFID tags. Many current UHF passive RFID tag systems employ PIE, wherein the tag includes a PIE decoder module. The PIE decoder module in known to consume a significant amount of power due to the fact, as described above, it uses a high frequency oscillator to determine the width of each portion of the encoded signal in order to distinguish a 1 bit from a 0 bit.

There is thus a need for an encoding scheme and associated decoder module that eliminates the use of a high power consuming clock (e.g., a high frequency clock), thereby lower power consumption at the receiving end.

SUMMARY OF THE INVENTION

In one embodiment, a method of decoding an encoded signal is provided that includes steps of receiving the encoded signal, creating a decoding signal by delaying the encoded signal by a predetermined amount of time $\Delta$, sampling the encoded signal using the decoding signal, and determining a value of each of a plurality of decoded bits represented by the encoded signal based on the sampling.

In another embodiment, a decoder circuit for decoding an encoded signal is provided that includes means for creating a decoding signal by delaying the encoded signal by a predetermined amount of time $\Delta$, and means for sampling the encoded signal using the decoding signal and determining a value of each of a plurality of decoded bits represented by the encoded signal based on the sampling.

In still another embodiment, a method of encoding a data signal including a plurality of first symbols and a plurality of second symbols is provided that includes creating an encoded signal based on the data signal, wherein in the encoded signal each of the first symbols is represented by a first square wave having a first period $P_0$ and a first duty cycle $D_0$ and each of the second symbols is represented by a second square wave having a second period $P_1$ and a second duty cycle $D_1$, and wherein $D_1 > D_0$ and $P_1 \geq P_0$.

In yet another embodiment, a method of operating a shift register having n sequentially arranged storage positions comprising a first position, a last position and one or more intermediate positions between the first position and the last position is provided, wherein a bit array stored by the shift register will shift by one position each time that at new bit is loaded into the first position. The method includes Causing the shift register to be in an initialization state wherein a first binary symbol is stored in the first position and a second binary symbol different than the first binary symbol is stored in each of the one or more intermediate positions and the last position, and determining that the shift register is full responsive to detecting that the first binary symbol has been stored in either one Of the intermediate positions or the last position.

These and other objects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

BRIEF DESCRIPTION OF THE DRAWINGS

FIGS. 5A-7B are schematic diagram representing operation of a counter-less shift register according to various exemplary embodiments;

DETAILED DESCRIPTION OF EXEMPLARY EMBODIMENTS

Figure 1:
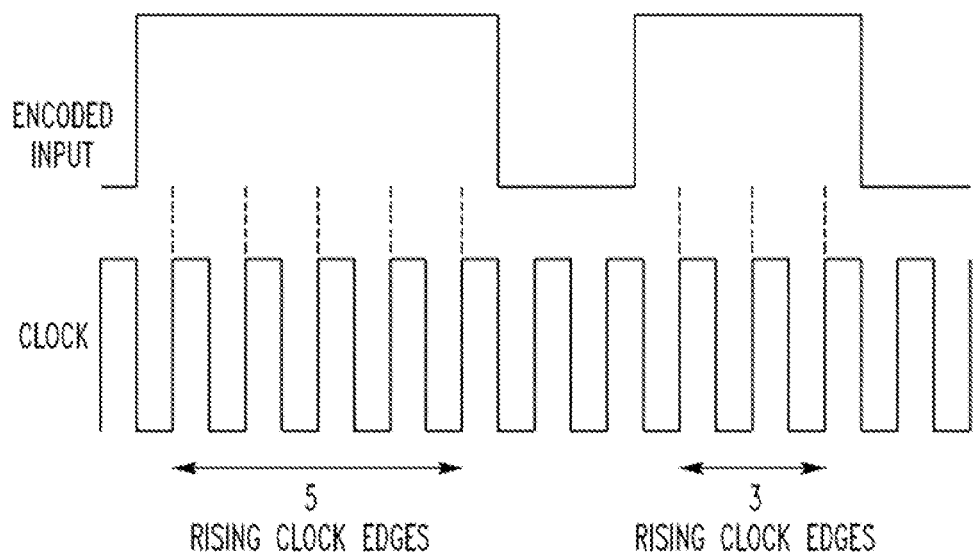
FIG. 1 is a schematic diagram representing a prior art PWC or PIE scheme.

As used herein, the singular form of "a", "an", and "the" include plural references unless the context clearly dictates otherwise. As used herein, the statement that two or more parts or components are "coupled" shall mean that the parts are joined or operate together either directly or indirectly, i.e., through one or MUM intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the word "unitary" means a component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components. As employed herein, the term "number" shall mean one or an integer greater than one (i.e., a plurality).

Directional phrases used herein, such as, for example and without limitation, top, bottom, left, right, upper, lower, front, back, and derivatives thereof relate to the orientation of the elements shown in the drawings and are not limiting upon the claims unless expressly recited therein.

In one aspect, the present invention provides a low-power pulse width coding scheme and associated decoding method and apparatus wherein a decoding mechanism is created from the encoded signal and is used to decode the encoded signal. This enables the decoding to be performed without the need for a high frequency clock signal, and thus reduces the power consumption of the decoder unit. In particular, as described in detail below, the decoding mechanism is created from the encoded signal by creating a decoding signal by delaying the encoded signal, preferably using only passive components in the form of a delay line or buffer or similar element. That decoding signal is then used to sample the encoded signal in order to decode the encoded signal. Thus, the low-power pulse width coding scheme of the present invention is an auto correlating scheme that reduces power consumption wherein the original encoded signal provides the decoding mechanism for the scheme.

Figure 2:
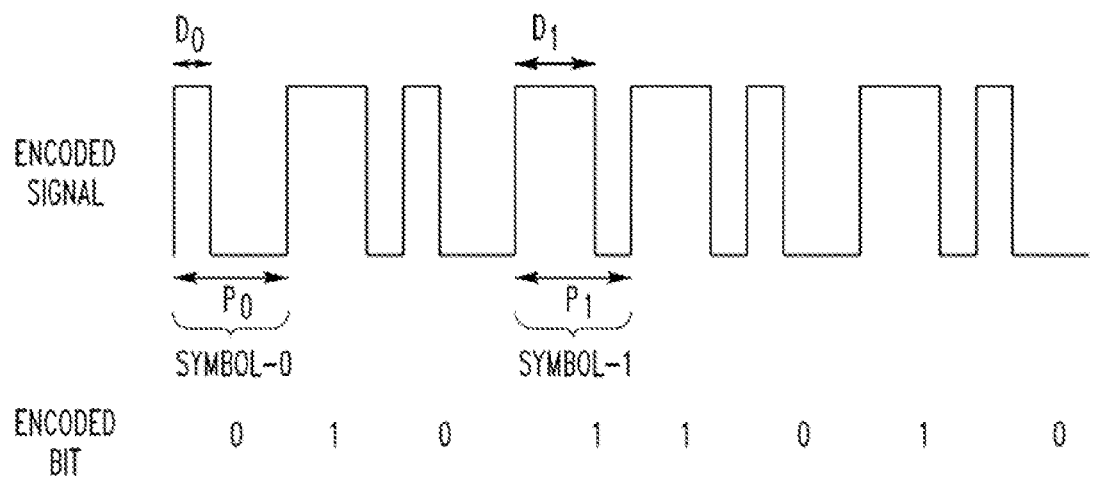
FIG. 2 is a schematic diagram representing a low-power pulse width coding scheme according to an exemplary embodiment of the present invention.

The pulse width coding scheme of the present invention will now be described with reference to FIG. 2 in connection with an exemplary embodiment thereof. As seen in FIG. 2, in the low-power pulse width coding scheme of the exemplary embodiment, the binary symbol "0" is represented by a square wave having a period $P_0$ and a duty cycle $D_0$ and the binary symbol "1" is represented by a square wave having a period $P_1$ and a duty cycle $D_1$. As used herein, the term "square wave" shall mean a signal that begins at a first level (e.g., logic high) and then, at some point within the square wave, switches from the first level to the a second level (e.g., logic low) different than the first level for the duration of the square wave (i.e., for the duration of the signal period). As used herein, the term "period" shall mean the amount of time in a square wave measured from the beginning of the first level to the end of the second level, and shall define one full cycle of the square wave. As used herein, the term "duty cycle" shall mean the amount of time in a square wave wherein the signal has a particular, predetermined one of the two levels therein, i.e., the first level or the second level, depending on the implementation. Thus, in FIG. 2, the waveform presented represents an example 8-bit input symbol data stream "01011010" in the present encoding scheme.

In addition, according to an aspect of the pulse width coding scheme of the present invention, $D_0 \ll D_1$ and $P_0 \leq P_1$. In other words, the duty cycle $D_1$ must be at least a predetermined amount greater than the duty cycle $D_0$, and the period $P_1$ must be greater than or equal to the period $P_0$. The predetermined amount by which D1 must be greater than $D_0$ will be determined based on the delay value ($\Delta$) of the embedded buffer element in the design as in FIG. 4. In various particular embodiments, the predetermined amount by which D1 must be greater than $D_0$ is at least 5%, at least 10%, at least 20% or at least 50%. In addition, for passive wireless devices (e.g., RFID tags) that harvest energy transmitted by a transmitter device (e.g., an RFID interrogator), it is preferable that $P_0 \ll P_1$. In various particular embodiments, the predetermined amount by which P1 must be greater than $P_0$ is at least 5%, at least 10%, at least 20% or at least 50%.

Figure 3:
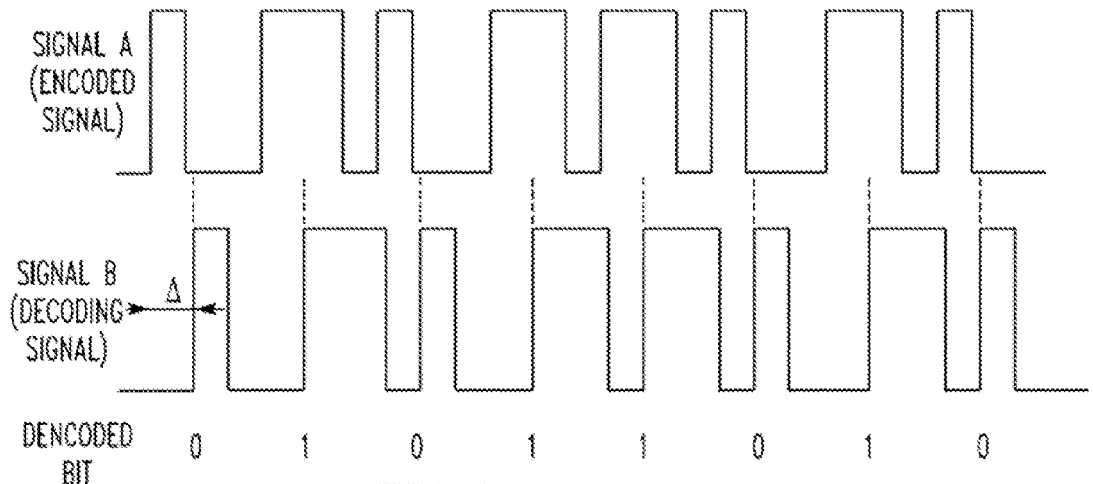
FIG. 3 is a schematic diagram representing how a signal encoded using the scheme of FIG. 2 may be decoded according to an embodiment of the present invention.

In order to decode an encoded signal that was encoded using the scheme just described, a decoding signal is created by delaying the encoded signal by a time $\Delta$, and the encoded signal is sampled using the decoding signal. In particular, as shown in FIG. 3, according to this sampling technique, the decoded binary symbol (the decoded bit) at each portion of the encoded signal (each portion corresponding to a square wave period) is the value (logic high or logic low) in the encoded signal that corresponds in time to each rising edge of the decoding signal. In the present invention, for the decoding to function properly, $D_0 < \Delta < D_1$. Thus, in a wireless serial data transmission system that employs a transmitter device and a receiver device and that employs the pulse width coding scheme of the present invention, data is communicated from the transmitter device to the receiver device as follows: (i) a data stream in the form of a series of binary symbols (i.e., 1s and 0s) is encoded using the scheme described above to generated an encoded data signal, (ii) the encoded data signal is transmitted from the transmitter device to the receiver using an appropriate modulation technique (i.e., the encoded data signal is used to modulate a carrier), (iii) the transmitted signal is received and demodulated at the receiver device in order to obtain the original encoded data signal, (v) the receiver device creates a decoding signal from the encoded data signal as just described (by delaying the encoded data signal), and (v)) the receiver device decodes the encoded data signal to extract/obtain the original data stream (the series of binary symbols) by sampling the encoded data signal using the decoding signal.

Figure 4:
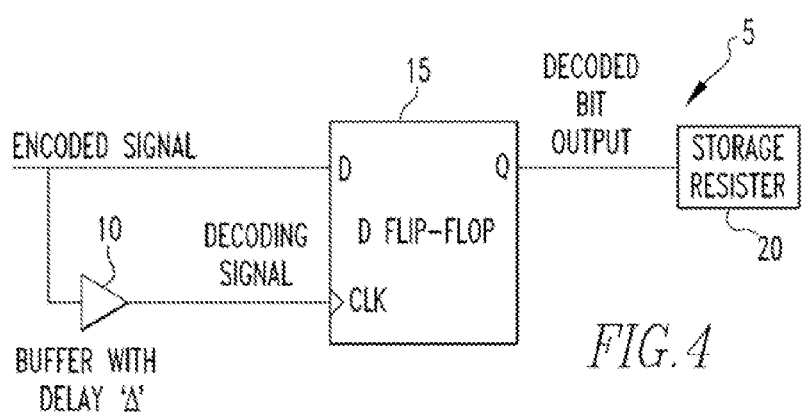
FIG. 4 is a schematic diagram of a decoder circuit according to an exemplary embodiment of the present invention.

FIG. 4 is a schematic diagram of a decoder circuit 5 according to one non-limiting, exemplary embodiment that may be used to decode and encoded signal that was encoded using the scheme of the present invention. As seen in FIG. 3, decoder circuit 5 is implemented as a digital circuit, and includes a delay buffer 10 that introduces a time delay equal to Δ, a D flip-flop 15 having D and clock (Clk) inputs and a Q output, and a storage register 20 (e.g., a shift register) that is coupled to the Q output of D flip-flop 15. The encoded signal to be decoded is fed to both the D input of D flip-flop 15 and the input of delay buffer 10. The output of delay buffer 10, which is the decoding signal described above, is fed to the clock (Clk) input of D flip-flop 15. In operation, with each rising edge of the decoding signal (created by the delay buffer 10), the value (logic high or logic low) of the encoded signal will appear on the Q output of D flip-flop 15 as the decoded bit output. The decoded bit output is then stored in a serial manner in storage register 20. It should be noted that decoder circuit 5 does not need a clock, signal, and thus consumes less power than a decoder that requires a high frequency clock signal.

The present inventors implemented and tested an embodiment of the present invention (including an embodiment of decoder circuit 5) wherein $P_0=P_1=25$ μs. $D_0=0.4$ ns, $D_1=20$ μs, and $\Delta=0.5$ ns. The present inventors also compared the performance of that embodiment to a conventional clocked PIE decoder. Post layout power simulation results were obtained using Cadence Encounter using 45 nm PTM library for 1.1 V $V_{DD}$ on Linux Platform. The post layout switching power consumption of the tested embodiment of the present invention was found to be 8.6 nW as compared to 2234 nW for the conventional clocked PIE decoder. Thus, the switching power consumption of the conventional clocked PIE decoder is about 260 times greater than the decoder of the present invention.

Figure 5A:
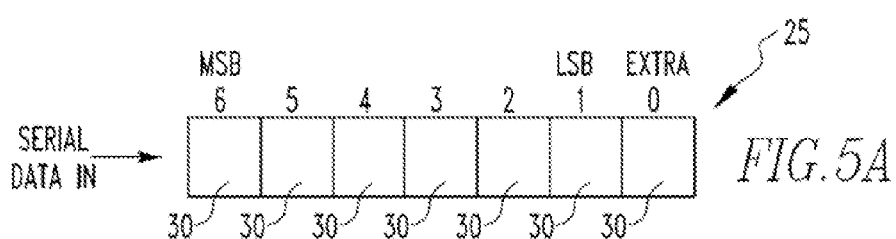

Referring to FIG. 5A, in a further aspect of the present invention and according to one exemplary embodiment, a counter-less shift register 25 is provided. In this exemplary embodiment, shift register 25 is provided with n storage positions 30 (identified by the position numbers 0-6 in FIG. 5A), and shift register 25 is structured to store a fixed length data word having n−1 bits. Thus, shift register 25 includes an "extra" storage position 30 that is provided at position 0 (with position 6 being the most significant bit (MSB) and position 1 being the least significant bit (LSB)). The function of the "extra" storage position 30 at position 0 is described in detail below. In order to illustrate the present embodiment, in FIG. 5A, n=7 and the fixed length data word is 6 (n−1) bits long. It will be understood, however, that this is meant to be exemplary only and that other values of n may also be used.

In shift register 25, each storage position 30 may be implemented in the form of a suitable flip-flop, such that shift register 25 comprises a cascade/chain of flip-flops in which the output of each flip-flop is connected to the data input of the next flip-flop in the chain. This will result in a circuit that shifts by one position the bit array stored in it each time that a new bit is loaded into the first position.

Figure 5B:
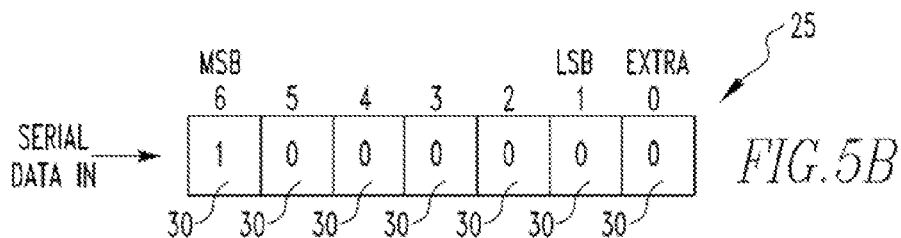

In addition, according to an aspect of the present embodiment, shift register 25 is provided with a unique reset/initialization condition, shown in FIG. 5B, wherein the MSB (position 6 in FIG. 5B) is set to 1 (logic high) and all other storage positions 30 (positions 0-5) are set to 0 (logic high) (i.e., the data word "1000000" is loaded into shift register 25). This unique reset/initialization condition thus provides the ability to easily determine/recognize when storage register 25 is full (i.e., has been fully loaded with the fixed length n−1 bit word) without the need for a counter simply by monitoring the state of the extra storage position 30 at position 0. In particular, after reset/initialization, as data is added to shift register 25, if that position is a 0 (logic low), the storage register 25 is not full. When that position becomes a 1 (logic high), the storage register 25 is full. This is illustrated in FIGS. 6A-6F, which shows the n−1 bit long data word "$D_5D_4D_3D_2D_1D_0$" being sequentially loaded into shift register 25. As seen in FIGS. 6A-6F, position 0 remains logic low until all of the n−1 bits have been loaded. Counter-less shift register 25 as just described, thus removes the need for a counter to determine if and when all of the bits have been loaded into shift register 25.

Figure 7A:
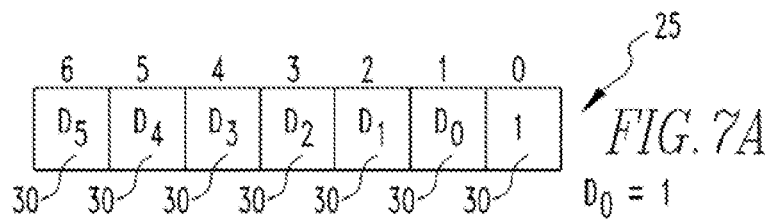
Figure 7B:
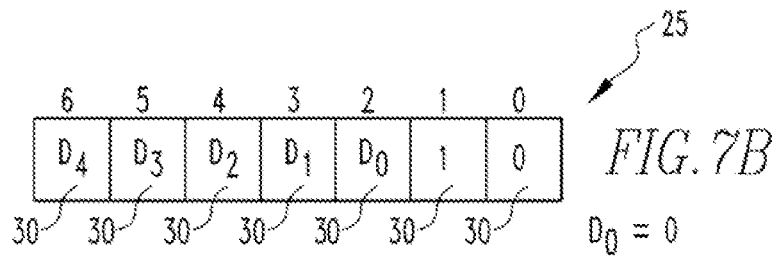

According to a further embodiment, counter-less shift register 25 may be used to store variable length data, i.e., data words having different lengths (e.g., different operations may be performed based on data length). For example, and without limitation, counter-less shift register 25 may be used to store data words having lengths n−1 (6 bits in the present example; data word "$D_5D_4D_3D_2D_1D_0$") and n−2 (5 bits in the present example; data word "$D_4D_3D_2D_1D_0$"). This is illustrated in FIGS. 7A and 7B. In this embodiment, part of the data word (e.g., the LSB ($D_0$) thereof) is used to indicate the length of the word currently being loaded into shift register 25. For example, $D_0=1$ may indicate that a word having a length of n−1 is currently being loaded and $D_0=0$ may indicate that a word having a length of n−2 is currently being loaded. In operation, immediately following reset/initialization as described above, position 6 the first loaded position) of shift register 25 is monitored to determine the state of $D_0$. That state will indicate which one of the storage positions 30 needs to be monitored for a change from 0 to 1 to indicate that the register is full. Thereafter, once determined to be full, the data word can be read out of shift register 25. It will be appreciated that the above is meant to be exemplary only, and that different word lengths (e.g., n−1, n−2, n−3 and n−4) and/or different parts of the data word to indicate current length being loaded (e.g., $D_1/D_0$, wherein 00=n−1, 01=n−2, 10=n−3 and 11=n−4) may also be employed within the scope of the present invention.

Figure 8:
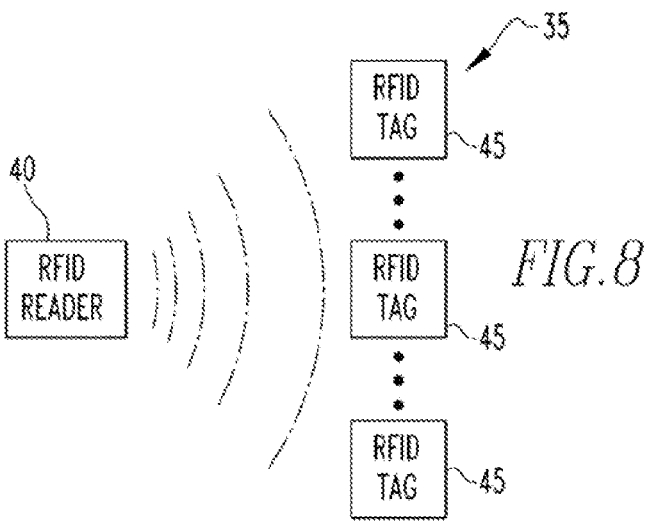
FIG. 8 is a schematic diagram of an RFID system according to an exemplary embodiment of the present invention.

FIG. 8 is a schematic diagram of an REID system 35 according to one particular embodiment that employs both the low-power pulse width coding scheme and associated decoding method and apparatus described herein in connection with FIGS. 1-4 and the counter-less shift register 25 described herein in connection with FIGS. 5A-7B. As is known in the art, RFID systems consist of a number of radio frequency tags or transponders (RFID tags) and one or more radio frequency readers or interrogators (REID readers). The RFID tags typically include an integrated circuit (IC) chip, such as a complementary metal oxide semiconductor (CMOS) chip, and an antenna connected thereto for allowing the RFID tag to communicate with an RFID reader over an air interface by way of RF signals. In a typical REID system, one or more RFID readers query the RFID tags for information stored on them, which can be, for example, identification numbers, user written data, or sensed data. RFID systems have thus been applied in many application areas to track, monitor, and manage items as they move between physical locations. Thus, RFID system 35 shown in FIG. 1 includes an RFID reader 40 and a plurality of RFID tags 45.

Figure 9:
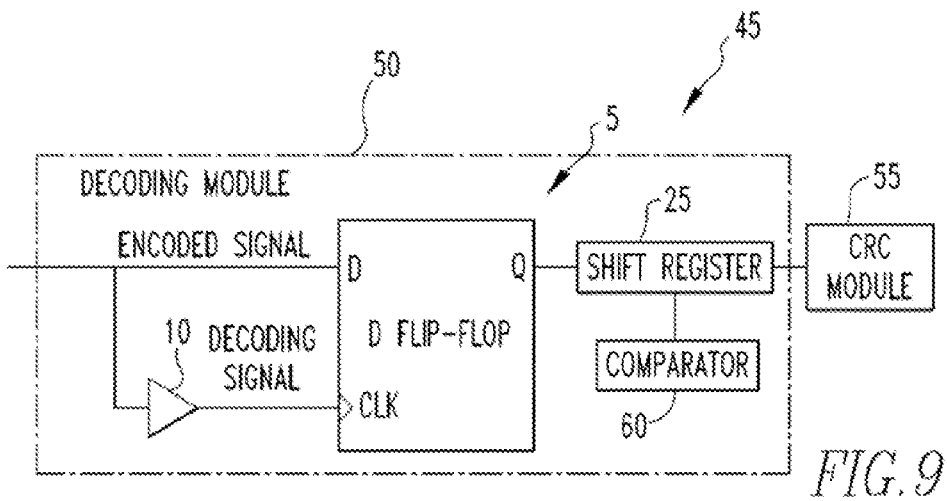
FIG. 9 is a schematic diagram of showing portions of an RFID tag forming part of the RFID system of FIG. 8.

FIG. 9 is a schematic diagram showing certain selected components/functionality of the RFID tags 45. In the present embodiment, RFID reader 40 is structured to transmit data to the RFID tags 45 using a known cyclic redundant code (CRC) for detecting errors in data transmission. Thus, for communicating information from RFD reader 40 to RFID tags 45, REID reader 40 will generate a data frame that includes a data bit stream with a CRC bit stream appended thereto, with that data frame being sent to the target REID tag 45 in encoded form as described herein (using the low-power pulse width coding scheme). As a result, as seen in FIG. 9, each REID tag 45 includes a decoding module 50 and a CRC module 55. The decoding module 50 is structured to receive the demodulated version of the encoded signal that was received by RFID tag 45 from RFID reader 40, and decode that signal (thereby obtaining the original data frame that includes the data bit stream with the CRC bit stream). The CRC module is structured to receive the decoded signal and perform the CRC error checking function on the decoded signal.

Thus, in the embodiment shown in FIG. 9, decoding module 50 includes decoder circuit 5 as described elsewhere herein that may be used to decode an encoded signal that was encoded using the low-power pulse width coding scheme of the present invention. As seen in FIG. 9, the storage register of decoder circuit 5 (labeled 20 in FIG. 4) is implemented in the form of shift register 25 described in detail in connection with FIGS. 5A-7B. Thus, decoding module 50 includes a comparator 60 which monitors the state of the "extra" storage position of shift register 25 in order to determine when shift register 25 is full as described elsewhere herein. When it is determined that shift register 25 is full, the data from shift register 25 (i.e., the data frame that includes the data bit stream with the CRC bit stream) is provided to CRC module 55 so that the appropriate CRC checking can be performed thereon.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A method of operating a shift register having n sequentially arranged storage positions comprising a first position, a last position and one or more intermediate positions between the first position and the last position, wherein a bit array stored by the shift register will shift by one position each time that a new bit is loaded into the first position, the method comprising:

causing the shift register to be in an initialization state wherein a first binary symbol is stored in the first position and a second binary symbol different than the first binary symbol is stored in each of the one or more intermediate positions and the last position, wherein the shift register is structured to store a data word having a length of n−1 bits; and determining that the shift register is full responsive to detecting that the first binary symbol has been stored in the last position.

2. The method according to claim 1, wherein the first binary symbol is represented by a logic high and the second binary symbol is represented by a logic low.

3. A method of operating a shift register having n sequentially arranged storage positions comprising a first position, a last position and one or more intermediate positions between the first position and the last position, wherein a bit array stored by the shift register will shift by one position each time that a new bit is loaded into the first position, wherein the shift register is structured to store data words having variable lengths of less than or equal to n−1, the method comprising:

causing the shift register to be in an initialization state wherein a first binary symbol is stored in the first position and a second binary symbol different than the first binary symbol is stored in each of the one or more intermediate positions and the last position;

determining a current length of a current data word based on a portion of the current data word that has been loaded into the shift registers; and determining that the shift register is full responsive to detecting that the first binary symbol has been stored in a particular one of the one or more intermediate positions and the last position, wherein the particular one of the intermediate positions and the last position is based on the determined current length of the current data word.

4. The method according to claim 3, wherein the first binary symbol is a 1 and the second binary symbol is a 0.

5. An RFID tag that that includes a shift register having n sequentially arranged storage positions comprising a first position, a last position and one or more intermediate positions between the first position and the last position, wherein a bit array stored by the shift register will shift by one position each time that a new bit is loaded into the first position, wherein the shift register is structured to store a data word having a length of n−1 bits, the RFID tag being structured to operate the shift register when decoding data that is sent to the RFID tag from an RFID reader by:

causing the shift register to be in an initialization state wherein a first binary symbol is stored in the first position and a second binary symbol different than the first binary symbol is stored in each of the one or more intermediate positions and the last position; and determining that the shift register is full responsive to detecting that the first binary symbol has been stored the last position.

6. An RFID tag that that includes a shift register having n sequentially arranged storage positions comprising a first position, a last position and one or more intermediate positions between the first position and the last position, wherein a bit array stored by the shift register will shift by one position each time that a new bit is loaded into the first position, wherein the shift register is structured to store data words having variable lengths of less than or equal to n−1, the RFID tag being structured to operate the shift register when decoding data that is sent to the RFID tag from an RFID reader by:

causing the shift register to be in an initialization state wherein a first binary symbol is stored in the first position and a second binary symbol different than the first binary symbol is stored in each of the one or more intermediate positions and the last position;

determining a current length of a current data word based on a portion of the current data word that has been loaded into the shift register; and determining that the shift register is full responsive to detecting that the first binary symbol has been stored in a particular one of the one or more intermediate positions and the last position, wherein the particular one of the intermediate positions and the last position is based on the determined current length of the current data word.

\* \* \* \* \*